(12) United States Patent
Johannessen et al.

(10) Patent No.: US 8,203,339 B2
(45) Date of Patent: Jun. 19, 2012

(54) APPARATUS FOR AND METHOD OF DETERMINING AN ANGLE BETWEEN AN ELEMENT AND A MAGNETIC FIELD

(75) Inventors: Ole Gustav Johannessen, Southampton (GB); Malcolm Harris Levitt, Southampton (GB)

(73) Assignee: University of Southampton, Southampton (GB)

( * ) Notice: Subject to any disclaimer, the term of this patent is extended or adjusted under 35 U.S.C. 154(b) by 468 days.

(21) Appl. No.: 12/446,828

(22) PCT Filed: Oct. 19, 2007

(86) PCT No.: PCT/GB2007/004003
§ 371 (c)(1),
(2), (4) Date: Nov. 9, 2009

(87) PCT Pub. No.: WO2008/050098
PCT Pub. Date: May 2, 2008

(65) Prior Publication Data
US 2010/0097060 A1    Apr. 22, 2010

(30) Foreign Application Priority Data

Oct. 23, 2006   (GB) .................................. 0621036.3
Dec. 1, 2006    (GB) .................................. 0624006.3

(51) Int. Cl.
*G01V 3/14*    (2006.01)
*G01V 3/32*    (2006.01)

(52) U.S. Cl. .......... 324/307; 324/316; 324/321; 600/407
(58) Field of Classification Search .......... 324/300–322; 600/407; 382/128–133
See application file for complete search history.

(56) References Cited

U.S. PATENT DOCUMENTS

| 4,926,121 A * | 5/1990 | Guay .......................... 324/207.2 |
| 5,760,586 A * | 6/1998 | Foerster et al. ............... 324/321 |
| 7,944,205 B2 * | 5/2011 | Fermon et al. ................ 324/306 |
| 2002/0011837 A1 | 1/2002 | Sato |

FOREIGN PATENT DOCUMENTS

DE    44 42 742 C1    5/1996

OTHER PUBLICATIONS

International Searching Authority, International Search Report and Written Opinion, Dated Feb. 19, 2008, Officer: Ian Chapple.

* cited by examiner

*Primary Examiner* — Melissa Koval
*Assistant Examiner* — Emily Chan
(74) *Attorney, Agent, or Firm* — DeMont & Breyer, LLC

(57) ABSTRACT

An apparatus comprising a magnetic field generator for generating a magnetic field of a predetermined orientation, an element provided in the apparatus at a location that, in use, is within a region of the magnetic field having the predetermined orientation generated by the generator, and a device for determining an angle between the element and the magnetic field, the device comprising a Hall Effect sensor.

20 Claims, 3 Drawing Sheets

APPARATUS FOR AND METHOD OF DETERMINING AN ANGLE BETWEEN AN ELEMENT AND A MAGNETIC FIELD

BACKGROUND OF THE INVENTION

1. Field of the Invention

This invention relates to an apparatus for, and method of, determining an angle between an element and a magnetic field. In particular, the invention relates to the measurement, with a high degree of accuracy, of the angle between the rotational axis of a rotating sample holder, and the direction of the magnetic field in nuclear magnetic resonance spectrometers, most particularly when the nuclear magnetic resonance device is used for analysis of solid-state samples.

2. Description of the Prior Art

In solid-state nuclear magnetic resonance spectroscopy (NMR) experiments the sample and sample holder (such holder is also called a rotor) are often rotated, around the principal axis of the rotor, at a precise angle (usually $\tan^{-1}\sqrt{2}=54.74°$ also known to those skilled in the art of NMR spectroscopy as the "Magic Angle") with respect to the direction of the main magnetic field. This technique can be used to increase the resolution achieved in a NMR experiment, improving the quality and analysis of the spectrum generated. The quality of data generated in such NMR experiments is highly sensitive to deviations from the desired angle. Routine experiments are sensitive to errors of around $\pm 0.1°$, and some NMR experiments are extremely sensitive to a precise setting of this angle with deviations of $\sim\pm 0.002°$ adversely affecting the quality of spectrum generated.

When conducting an NMR experiment the rotor is seated in the stator of a probe which is inserted into the bore of the NMR magnet. The rotor and stator are engineered to provide a precise fit of the rotor into the stator with a tolerance of a few micrometers. The rotor axis and stator axis are thus within millidegrees of absolute alignment with each other. Usually the angle at which the stator, and hence rotor, is held with respect to the probe is adjusted mechanically by turning a knob on the base of the NMR probe. Other adjustment systems may also be used. The angle set between the stator axis and magnetic field direction is estimated based on the orientation of the probe with respect to the magnetic field direction.

None of the currently available systems for adjusting rotor angle provide direct or sufficiently accurate feedback on the actual angle between the magnetic field direction and the stator axis or rotor axis. The only means of directly and accurately measuring the angle between the rotor axis and the magnetic field direction is to undertake an NMR experiment followed by careful analysis of the results to assess whether actual angle was, in fact, at the intended angle setting. This analysis is a straightforward task for suitable operators as, for example, the shape of the spectral lines generated is highly sensitive to the spinning angle.

For these reasons, whilst the operator will seek to position the rotor at the desired (specific) angle, there is considerable difficulty in setting the angle between the rotational axis and the direction of the magnetic field precisely within the desired error limits of $\sim\pm 0.1°$ for many NMR experiments, up to $\sim\pm 0.002°$ for a number of particularly sensitive experiments. In practice setting the angle to the desired value for a particular experiment is a trial and error process. Furthermore, small angular deviations from the desired spinning angle that may occur due to mechanical slip or thermal expansion after the angle has been set by the operator cannot be detected, using currently known systems and methods, until the NMR experiment has been completed and analysed.

This current limitation of NMR machines, with respect to Solid State NMR (SS NMR) means that a repeated series of sequential experiments, analysis and mechanical adjustment of the probe angle may be necessary to achieve the desired angle and hence resolution. Thus the current inability to accurately measure and therefore adjust rotor angle prior to commencing an NMR experiment is detrimental in terms of both operator and spectrophotometer time. Current technology also limits usage of angle-sensitive NMR techniques to highly skilled operators. Additionally, for short-lived samples, there may be insufficient time to undertake such a series of adjustments and the opportunity to collect data of a precious sample may be lost. These factors limit the ability of such techniques to be automated and standardized, and inhibit uptake of these techniques by broader scientific and industrial user groups.

Therefore there is a clear need in the field of solid state NMR spectroscopy for a means of accurately determining the angle between the rotational axis of the rotor (sample holder) and the direction of the magnetic field, preferably in real time.

There is also a clear need in the field of solid state NMR spectroscopy for a means of accurately adjusting the angle between the rotational axis of the rotor (sample holder) and the direction of the magnetic field automatically.

SUMMARY OF THE INVENTION

The present invention aims, at least partially, to provide a solution, not previously conceived, to at least one of these needs.

Accordingly, in a first aspect the present invention provides an apparatus comprising a magnetic field generator for generating a magnetic field of a predetermined orientation, an element provided in the apparatus at a location that, in use, is within a region of the magnetic field having the predetermined orientation generated by the generator, and a device for determining an angle between the element and the magnetic field, the device comprising a Hall Effect sensor.

The Hall Effect sensor may be mounted on the element, or mounted on a support for the element. When mounted on a support for the element, the Hall Effect sensor may be mounted in a bracket that is mounted on a common support for the bracket and the element, whereby the bracket fixes the orientation of the Hall Effect sensor relative to the element.

Preferably, the Hall Effect sensor has a plane that is oriented so as to be at a predetermined angle with respect to a region of the magnetic field that passes, in use, through the Hall Effect sensor. More preferably, the plane of the Hall Effect sensor is oriented so as to be at an angle of no more than 45°, yet more preferably no more than 5°, with respect to the region of the magnetic field that passes, in use, through the Hall Effect sensor. Still more preferably the Hall Effect sensor has a plane that is oriented so as to be substantially parallel to a region of the magnetic field that passes, in use, through the Hall Effect sensor.

The magnetic field generator may have high strength, and in particular may be adapted to generate a magnetic field of at least 94 kiloGauss.

In a particularly preferred embodiment, the element is a part of a rotatable mechanism, and preferably the Hall Effect sensor is mounted at a known fixed angle with respect to a rotational axis of the rotatable mechanism. The rotatable mechanism preferably comprises a stator supporting a rotor, and the element comprises the stator on which the Hall Effect sensor is mounted. The rotor may be adapted to hold a sample to be tested by the apparatus by being rotated within the magnetic field. Most preferably, the apparatus is a nuclear magnetic resonance (NMR) spectrometer.

Preferably, the device for determining an angle between the element and the magnetic field further comprises a voltage measuring apparatus connected to the Hall Effect sensor for measuring the Hall voltage of the Hall Effect sensor. The device may further comprises an angle calculating device, for calculating an angle of the element with respect to the magnetic field, based on a measured value of the Hall voltage. The angle calculating device may optionally calculate an angular deviation, relative to an angle of 54.74 degrees, of the rotational axis with respect to the magnetic field.

The apparatus may further comprise a system for adjusting the angle of the element and the magnetic field in response to an output of the Hall Effect sensor.

The Hall effect sensor is preferably arranged to determine an angle between a plane in which the Hall effect sensor lies and the direction of the magnetic field with an accuracy of ±0.5°, more preferably ±0.1°, yet more preferably ±0.01° and still more preferably ±0.002°.

The Hall effect sensor is preferably arranged the angle between the direction of the magnetic field and the rotational axis of the rotor within the stator with an accuracy of ±0.5°, more preferably ±0.1°, yet more preferably ±0.01°.

In a second aspect the present invention provides a method of determining an angle between an element and a magnetic field, the method comprising the step of measuring a Hall voltage of a Hall Effect sensor mounted with respect to an element that is disposed within a magnetic field of a predetermined orientation and determining an angle between the element and the magnetic field based on a measured value of the Hall voltage.

The Hall Effect sensor has a plane that is preferably oriented so as to be at a predetermined angle with respect to a region of the magnetic field that passes through the Hall Effect sensor. The angle is preferably no more than 45°, more preferably no more than 5° and most preferably the Hall Effect sensor has a plane that is oriented so as to be substantially parallel to a region of the magnetic field that passes, in use, through the Hall Effect sensor.

Preferably the magnetic field has a high magnetic field strength, in particular at least 94 kiloGauss.

In a third aspect the present invention provides the use of a Hall Effect sensor mounted on the stator, bearing a rotatable sample holder, of a probe of a nuclear magnetic resonance (NMR) spectrometer to determine the angle between the rotational axis of the stator and the direction of a magnetic field within the nuclear magnetic resonance (NMR) spectrometer.

The determined angle is preferably employed to provide a feedback adjustment to set the angle to a desired value.

The preferred embodiment of present invention is an apparatus, and the use thereof, which provide a means of accurately determining, and optionally setting, the angle between the rotational axis of a stator bearing a rotor (sample holder) and the direction of magnetic field. A first aspect of the preferred embodiment is an apparatus comprising a Hall Effect sensor mounted on the stator of an NMR probe bearing a rotor, where the Hall Effect sensor is mounted at a known fixed angle to the rotational axis of the stator, and the probe is suitable for conducting NMR experiments on solid state samples in which the samples are spun within an NMR spectrometer. The Hall voltage (the voltage generated perpendicular to the current direction in the Hall device) measured from this Hall effect sensor can be used to determine the angle between the plane in which the Hall effect sensor lies, and so hence that on which the rotational axis of the stator lies, and the direction of the magnetic field with a high degree of accuracy, preferably more accurate than ±0.5°, more preferably more accurate than ±0.1°, more preferably still more accurate than 0.01°; most preferably more accurate than ±0.002°. The angle between the direction of the magnetic field and the rotational axis of the rotor within the stator is determined with a high degree of accuracy, preferably more accurate than ±0.5°, more preferably more accurate than ±0.1°, more preferably still more accurate than ±0.01°.

A second aspect of the preferred embodiment is the use of a Hall Effect sensor mounted on the stator of an NMR probe to determine the angle between the rotational axis of a stator bearing a rotor (sample holder) and the direction of magnetic field with a high degree of accuracy. A third and fourth aspect of the preferred embodiment is a method of using the measured angle as feedback to an adjustment system, including automatic motorized systems, to automatically set the desired angle and an apparatus for providing this.

Normally, a Hall sensor is mounted in the perpendicular geometry. This means that the semiconductor Hall plane is oriented so that the normal to the plane is parallel to the magnetic field. In this geometry, the Hall voltage is proportional to the magnetic flux density B, and is insensitive to small changes in the angle between the Hall plane and the magnetic field.

The present invention in contrast is predicated on the use of an unconventional parallel geometry, in which the Hall plane is oriented parallel to the magnetic flux lines. In this case, the Hall voltage is close to zero and depends strongly on the angle between the Hall plane and the magnetic field. In NMR experiments, the magnetic flux density is known with great accuracy and is highly stable, so only the angular dependence is important. Measuring the Hall voltage under these conditions can enable the angle to be determined accurately.

BRIEF DESCRIPTION OF THE DRAWINGS

An embodiment of the present invention will now be described by way of example only, with reference to the accompanying drawings, in which.

DETAILED DESCRIPTION OF THE PREFERRED EMBODIMENTS

The Hall Effect and use of Hall Effect sensor devices are well known. Known uses of Hall Effect sensors include fluid flow sensors, electrical power sensors, pressure sensors, measurement of magnetic fields as electronic compasses, rotational sensing and switch sensing.

Figure 1:
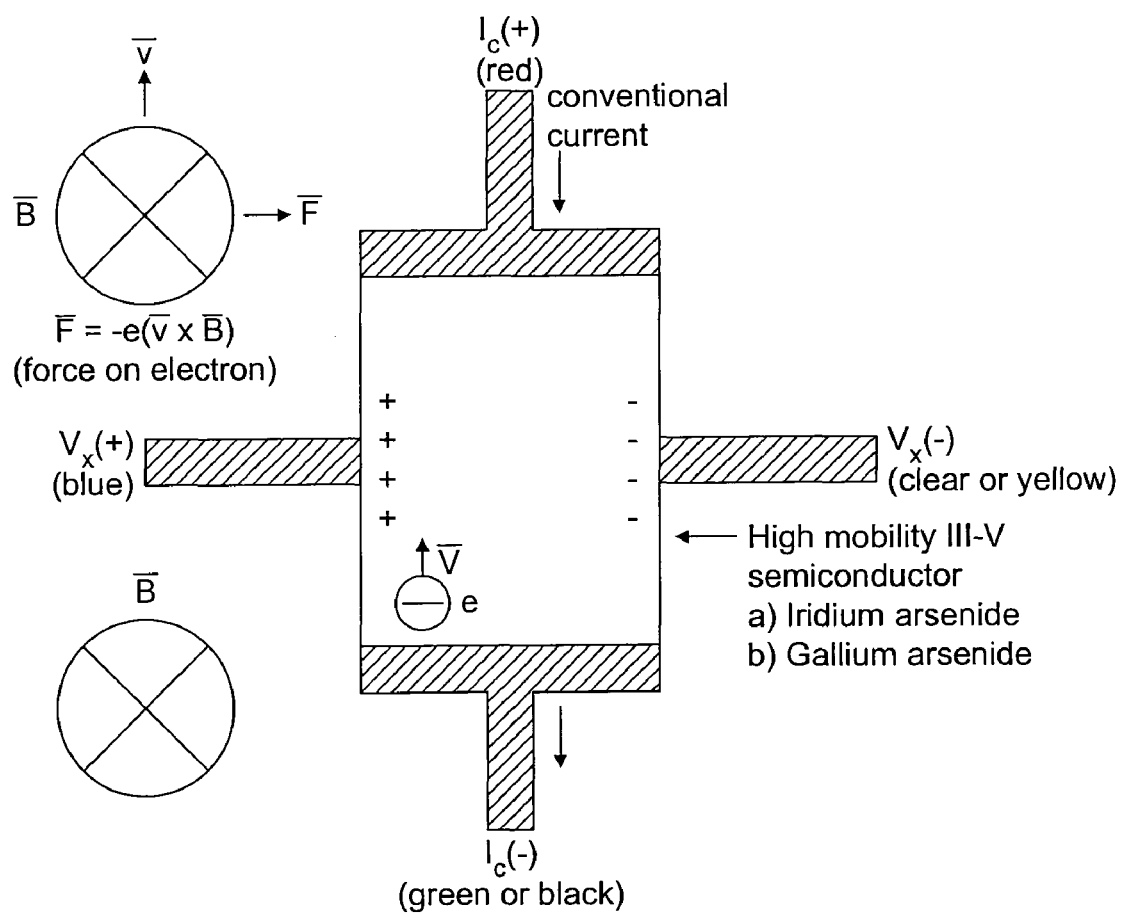
FIG. 1 shows the design and configuration of a known Hall Effect sensor.

A Hall Effect device is a small semiconductor chip with four connections, as shown in FIG. 1.

A known current, $L_c$, is passed from the "red" to "green" (or "black") terminals (shown in FIG. 1), and the voltage, $V_{Ban}$, is measured across the "blue" to "yellow" terminals. The $V_{Hall}$ measured is determined by the strength of magnetic field applied and the properties of the semiconductor chip and can be expressed as:

$$V_{Hall} = g_B B \cos \theta + V_{Hall}^0$$

where gB is the magnetic sensitivity (specified for a given Hall effect device at a fixed current), B is the magnetic flux density, and θ is the angle between the magnetic flux vector and the normal to the plane of the Hall device. Using SI units, $V_{Hall}$ is specified in Volts, B in Tesla, and $g_B$ in $VT^{-1}$. Alternatively, B may be specified in kiloGauss units, where 1 Tesla=10 kiloGauss), and $g_B$ expressed in $mVkG^{-1}$.

The term $V_{Hall}^0$ represents a possible residual Hall voltage at θ=zero, derived from the magnetoresistance anisotropy properties of the Hall device used.

The angular sensitivity of $V_{Hall}$ is obtained by differentiating the above equation with respect to θ to derive:

$$dV_{Hall}/d\theta = -g_B B \sin\theta$$

and also $$V_{Hall} \propto I_c B \sin\theta$$

The sensitivity of $V_{Hall}$ to angular variation is a potential source of error in measurements of the magnetic flux density B. A Hall Effect device as described above is known primarily for use in measuring magnetic field strength, i.e. magnetic flux (B). In order to measure B, Hall devices are usually oriented perpendicular to the magnetic field, in which case the normal to the plane of the device shall lie in the plane of the direction of the magnetic field, i.e. θ=0, hence θ sin θ=0, and the angular sensitivity of $V_{Hall}$ is minimized.

The present invention is predicated on a different application and use of such known Hall Effect sensors.

In particular, the present invention concerns the application of Hall Effect sensors, in particular within very high magnetic field strengths, for example 94 kiloGauss and higher, to enable angular measurements of the orientation of the sensor itself within the magnetic field of known orientation. Such an angular measurement can be made with a high degree of accuracy.

A particular application of the present invention is the use of such sensors in the field of nuclear magnetic resonance spectroscopy, and more specifically their use to provide highly accurate (more accurate than ±0.5°, preferably more accurate than ±0.1°, more preferably more accurate than ±0.01°; more preferably still more accurate than ±0.002°) angular positional information between the plane of an object on which the Hall effect sensor is mounted and the direction of a magnetic field, in particular where such object is a rotor-bearing stator, within a nuclear magnetic resonance spectrometer.

In the present invention, a different arrangement from the known arrangement described above is proposed. Since the flux density, B, and in particular its orientation, is now known with a high degree of accuracy, the purpose of the Hall Effect sensor within the present invention is to determine, to a high degree of accuracy, the angle, thus indicating to the operator whether the actual angle (orientation) of the axis of the stator bearing the rotor is at the desired angle setting. This desired angle may be most usually the Magic Angle, but a range of other angles may also be desired for particular NMR experiments.

The ability of Hall Effect sensors to provide highly accurate angular measurements of the sensor itself with a given known high strength magnetic flux is a totally different application from the known uses of Hall Effect sensors discussed above. This application in addition provides highly accurate angular measurements of the element within an apparatus, in particular a testing apparatus (e.g. NMR) that itself generates the magnetic field, to which the sensor is mounted. The present inventors have found that in combination with very high strength and very stable magnetic fields, within a range of orientations very small changes in the angle of the sensor relative to the magnetic field result in detectable changes in $V_{Hall}$ from which the angle can be calculated to a high degree of accuracy.

Figure 2:
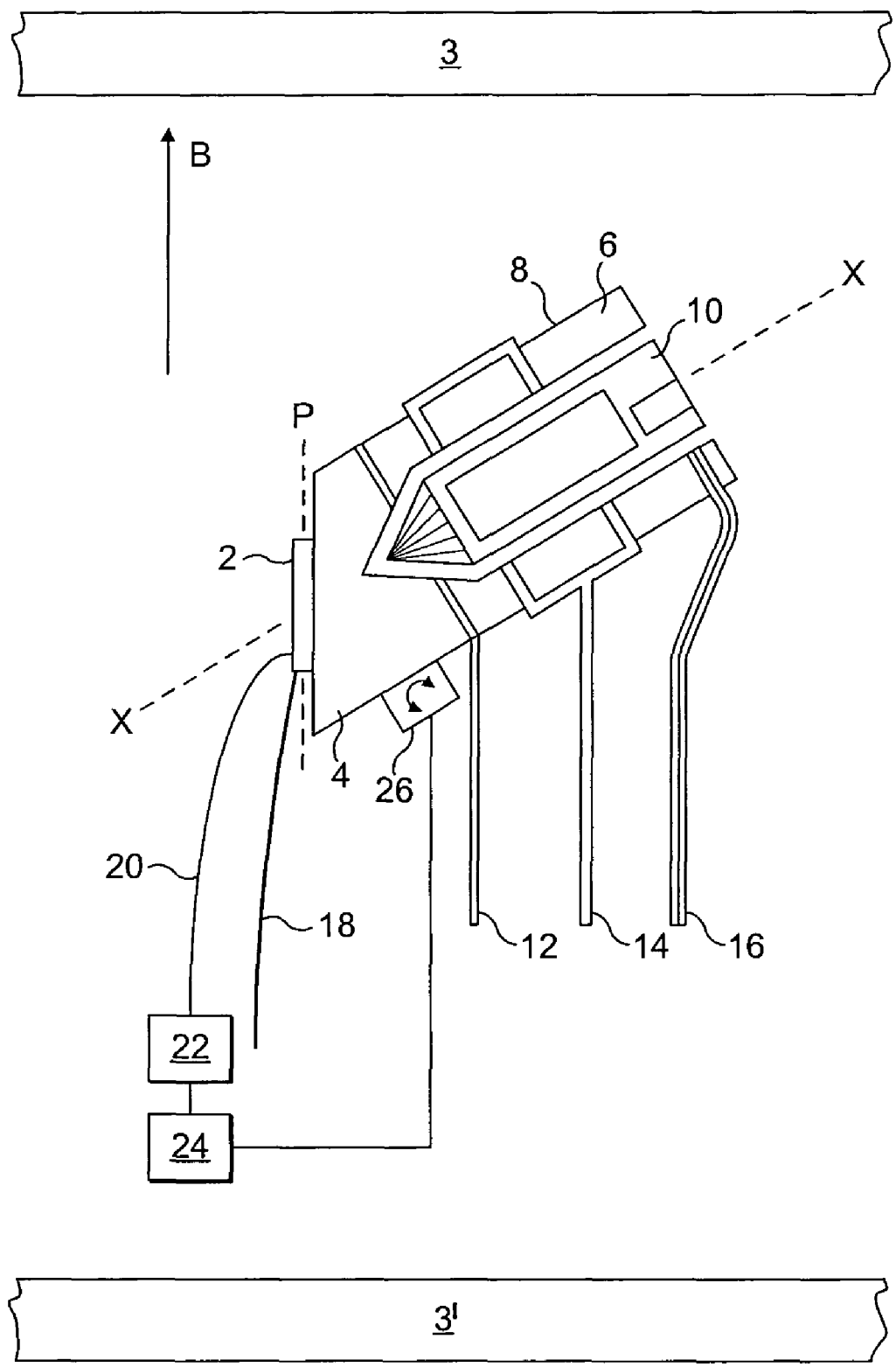
FIG. 2 is a schematic diagram showing a nuclear magnetic resonance (NMR) spectrometer incorporating a Hall Effect sensor for measuring the angle of the stator of the spectrometer with respect to the applied magnetic filed in accordance with a preferred embodiment of the present invention.

Referring to FIG. 2, this illustrates the use of a Hall Effect sensor within a NMR apparatus in accordance with an embodiment of the present invention.

As illustrated in FIG. 2, the sensing device, in particular the Hall Effect sensor 2, is mounted on a part 4 of the stator 6 of an NMR probe 8. A magnetic field generator, illustrated schematically as 3, 3', of the NMR apparatus generates a magnetic field of known strength and orientation, which is fixed, and the NMR probe 8 lies within that magnetic field. The orientation of the plane, indicated as P, of the Hall Effect sensor 2 is such that orientation of the magnetic field, the direction of the magnetic flux being indicated by the arrow B, lies as close as possible to the plane of the Hall device (i.e. θ=close to π/2), when the rotational axis X-X of the NMR probe 8, and thereby the stator axis and the rotational axis of the rotor 10 located within the stator 6, is at the desired angle, typically the Magic Angle, with respect to the field.

In known manner, the NMR probe 8 is provided with a drive air supply 12 to rotate the rotor 10 within the stator 6 and a bearing air supply 14 for feeding air bearings (not shown) located around the rotor 10. An optical fibre tachometer 16 is provided for detecting the rotational velocity of the rotor 10 within the stator 6.

The Hall Effect sensor 2 is provided with first leads 18 to supply electrical current to the Hall Effect sensor 2 (on terminals $I_c(+)$ and $I_c(-)$ shown in FIG. 1) and second leads 20 to take voltages from the Hall Effect sensor 2 (on terminal $V_x(+)$ and $V_x(-)$ shown in FIG. 1). The second leads 20 are connected (optionally by an amplifier, not shown) to a voltage measuring apparatus 22 for measuring the Hall voltage $V_{Hall}$ of the Hall Effect sensor 2, which is in turn connected to an angle calculating device 24, for calculating an angle of the stator 6 with respect to the magnetic field, based on a measured value of the Hall voltage. The angle calculating device 24 may calculate an angular deviation, relative to the Magic Angle of 54.74 degrees, of the rotational axis X-X with respect to the magnetic field.

The apparatus may further comprise a system, illustrated schematically as 26, connected to the angle calculating device 24, for adjusting the angle between the stator 6 and the magnetic field in response to the output of the Hall Effect sensor 2.

In the illustrated configuration, sin θ is close to 1 and the voltage sensitivity, with respect to angular variation, is $\sim g_B B$. As B is large, typically at least 94 kG, very small changes in angle result in accurately measurable changes in the Hall voltage. The angular sensitivity of the device is at its greatest at θ=π/2. However, exact alignment of these planes is not required to enable the desired degree of accuracy in angular measurement. Preferably the planes are aligned within 45°, more preferably within 20°, more preferably still within 10°, more preferably still within 5°, and most preferably within 2°.

As described above and illustrated in FIG. 2, the direction of the magnetic field is as close as possible to the plane of the Hall device 2, when the stator axis is at the required angle with respect to the magnetic field. When the magnetic field is exactly in the plane of the Hall device 2 (θ=π/2), the Hall voltage is expected to be zero.

Figure 3:
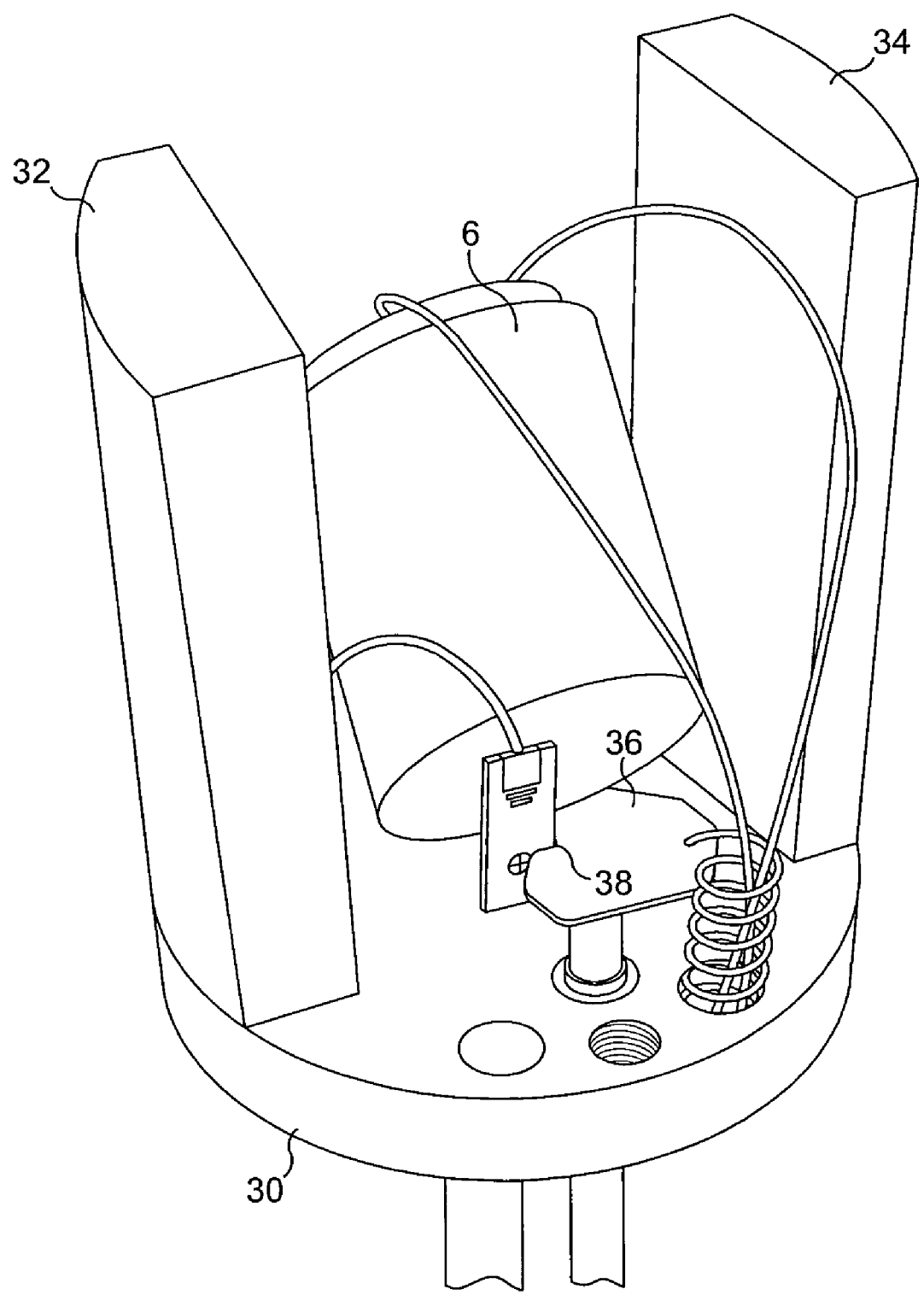
FIG. 3 shows a preferred arrangement of a Hall Effect sensor mounted in a bracket at a specific angle relative to a Magic angle spinning stator.

Referring to FIG. 3, in accordance with one particular embodiment the stator 6 is mounted on a mounting plate 30 between opposed mounts 32, 34, and the mounting plate 30 is mounted inn the NMR spectrometer with respect to the magnetic field so that the stator 6 is mounted at the Magic angle (i.e. it then constitutes a Magic angle spinning (MAS) stator). A bracket 36 is also mounted on the mounting plate 30. The bracket 36 includes a slot 38 in which the planar Hall Effect sensor 2 is securely fitted. The slot 38 is for example orthogonal to the planar mounting surface of the mounting plate 30 and the stator 6 is mounted at the Magic angle to the direction of the slot 38. The bracket 36 ensures that the Hall Effect sensor 2 is rigidly mounted at the desired angle with respect to the magnetic field. A locking mechanism (e.g. a screw or bolt) may be provided in the bracket 36 to lock the Hall Effect sensor 2 at the desired position within the slot 38.

Due to mechanical tolerances and the small size of the Hall Effect sensor 2, the precision with which the plane of the Hall Effect sensor 2 can be aligned with the designed plane on the stator 6 is limited to around 2-3 degrees. Furthermore, the Hall effect device 2 may also have an intrinsic small offset Hall voltage, $V_{Hall}^0$, in this geometry. Calibration of the stator-Hall effect device apparatus to determine the $V_{Hall}$ at a specific exact angle, conveniently the Magic Angle, is therefore preferred and generally required and can be achieved by conducting an angle-sensitive NMR experiment. The 'compensation voltage' measured in such calibration can be used as the reference point for calculating from further measurements of $V_{Hall}$, either manually or used to null the voltage reading via a compensation circuit (not shown) in a similar manner to 'taring' a balance/scales.

The rotor 10 (being the sample holder) is engineered to fit into the stator 6, which is equipped with bearings and turbine to spin the rotor, with a tolerance of a few micrometers. Depending on rotor fit, temperature and spin speed there may be very small deviations, <0.01°, between the rotational axis of the rotor 10 and the axis of the stator 6. Thus whilst the invention provides a direct real time measurement of the stator angle, the angle of the rotor 10 is inferred with an accuracy of ~±0.01° or better. For many NMR experiments this degree of accuracy is sufficient and provides a solution to the need for accurately determining the angle between the rotational axis of the rotor (sample holder) and the direction of the magnetic field in real time.

For NMR experiments requiring accuracy of >±0.002° the invention provides a valuable aid to setting an initial angle that may require minor adjustment. Furthermore, the invention will provide previously unavailable information on the relative axis of the stator 6 and rotor 10 under various experimental conditions, which will enable optimization of these conditions and rotor/stator design to provide alignment of rotor and stator axes.

Most commonly, the invention is used to accurately set the rotational axis of the stator 6 to the Magic Angle, and the plane of the Hall effect device 2 is positioned such that it is closely aligned with the magnetic field direction when the stator axis is at the Magic Angle. For experiments using off-Magic Angle spinning, the same configuration of stator-Hall effect device may be used, however the accuracy with which angular changes can be measured decreases as θ moves away from pi/2. Typically such off-Magic angle spinning experiments have an angular sensitivity of ~0.1°, for which θ close to pi/2 is not required. Where a high degree of angular accuracy is required for off-Magic Angle spinning experiments, the stator-Hall effect device assembly may be configured such that the plane of the Hall effect device is closely aligned with the magnetic field direction when the stator axis is at the desired non-Magic Angle. A single stator may be configured with a greater than one Hall effect device set at different angles to the stator axis to provide high angular sensitivity at greater than one angle.

Other embodiments of the Invention include:
(i) using a stepper motor, or other form of adjustment of the angle between the rotor and direction of the magnetic field, with feedback to adjust the angle automatically to any desired value and
(ii) allowing the operator of an NMR spectrometer to set, either manually or pre-programme automatic adjustment to provide, a series different spinning angles during an NMR experiment.

Although the present invention has been described with primary reference to an NMR spectrometer, the apparatus and method of the invention may be used in other devices, in particular other testing apparatus, incorporating a known magnetic field, for example an electric spin resonance (ESR) spectrometer.

The present invention is described further with reference to the following non-limiting Examples.

Example 1

A suitable Hall effect device is Lakeshore HGCT-3020, obtainable from Lake Shore, Cryotronics, Inc., 575 McCorkle Blvd., Westerville Ohio 43082, USA.

The Lakeshore HGCT-3020 used in the following measurement has gB=0.55 mV kG$^{-1}$ at the nominal control current of 100 mA. A typical 400 MHz NMR magnet has B=9.4 T=94 kG. So the angle sensitivity of the device at θ=0 is 0.55×94 mV rad$^{-1}$=52 mV rad$^{-1}$. This can be converted to degrees to get dVH/dθ=52×π/180 mV deg$^{-1}$=0.9 mV deg$^{-1}$.

Hence a change in the angle by 1/1000 degree leads to a 0.9 microvolt change in the Hall voltage. This is easily measurable. For example, the Agilent 34420A nanoVolt meter (available from Agilent Technologies Inc, 5301 Stevens Creek Blvd, Santa Clara, Calif. 95051 USA) specifies 100 pV sensitivity. This is 104 more sensitive than is required to detect this magnitude of voltage change.

Mounting of the Hall Effect device on the stator is not precise, such that the Hall effect device is ±2 degrees off exact alignment with the magnetic flux vector when the stator is set to the desired angle to the magnetic field direction within the NMR magnet. A 2 degree angle miss-set gives a Hall voltage of 0.9 mV×2=1.8 mV. Hence the alignment error gives rise to a up to 2 mV offset voltage even at the exact magic angle. In addition $V_{Hall}^0$ will contribute to an offset voltage (also likely to be in the mV range).

These "offset" terms are zeroed by a calibration procedure when the device is set up. An NMR experiment is used to set the exact Magic Angle, and the Hall voltage zeroed out using a suitable compensation circuit. To get 1/1000 deg accuracy, the mV offset voltage needs to be compensated with an accuracy of 1 microvolt, i.e. about 0.1%. An example of a suitable offset device is a Keithley 2600 DS source (available from Keithley Instruments Inc, Cleveland, Ohio, USA) which has a better than 0.1% accuracy.

This system provides for the angle between the rotational axis of the stator and the magnetic field direction to be determined, most conveniently as deviation from the Magic Angle, to an accuracy of at least 1/1000 of a degree.

The Hall voltage is proportional to the supplied current. Hence the stability of the supplied current is also important. A high-quality source such as the Keithley 2600 DS has a 1-year accuracy of 0.03% on the 100 mA range. When the Hall plane is within 2 degrees of being aligned with the field, a change of 0.03% in the current gives a 0.03%×1.8 mV=0.5 microV. This is of the same order as the 0.9 microvolt change in the Hall voltage on an angle change of 1/1000 degree. So sufficient stability of the current source is achievable for a 1/1000 degree angle measurement.

The angle sensitivity is directly proportional to the applied magnetic field. The above example is based on a 9.4 T magnet which are the lowest strength magnets routinely used for solid-state NMR. Higher angle accuracy is feasible for higher strength magnets.

Example 2

The method and apparatus of the present invention were tested by fixing the Lakeshore HGCT-3020 Hall probe to a modified Varian 4 mm magic-angle-spinning stator in the field-parallel geometry, as shown in FIG. 3. The supply current=100 mA was generated by a home-built stabilized current source, with an accuracy of around 1%. The current source was connected to the Hall effect device by a twisted pair of leads, in order to minimize the interference of the supply current with the magnetic field homogeneity at the sample. The Hall voltage was monitored outside the probe by a standard 7-digit voltmeter. This was operated in a time-averaging mode, with an averaging duration of around 1 second, in order to reduce interference from low-frequency ambient electric fields. Initially, troublesome interference was encountered from radio signals picked up by the Hall probe leads and coupled to the NMR receiver circuit. This interference was reduced to acceptable levels by improving the rf shielding of the Hall device leads.

The Hall device was tested by performing NMR experiments over a range of spinning angles, while monitoring the Hall voltage. The spinning angle was varied by turning the usual mechanical drive on the probe base, which rotates the stator around an axis perpendicular to the magnetic field. The true spinning angles were determined by comparing the NMR spectra with SIMPSON simulations (see M. Bak, J. T. Rasmussen and N. C. Nielsen, *J. Magn. Reson.* 147, 296-330 (2000)).

There are many NMR experiments that are extremely sensitive to the spinning angle, and some experiments are sensitive to deviations from the magic angle by only a few millidegrees. However, a reliable and simple known method for determining the spinning angle over a range of around 1 degree is less easy to find. Accurate simulation of off-MAS lineshapes usually requires accurate knowledge of multiple spin interaction tensors and their relative orientations. The inventors have generally found that literature values are not sufficiently accurate for this purpose. In fact the inventors suspect that off-magic-angle spinning could be a good method to refine estimates of spin interaction parameters.

For this example, the $^{31}$P NMR spectra of trimethyl phosphine sulfide (TMPS, (CH3)3PS) were used. The crystal structure of this compound is very simple, with two molecules in the unit cell, related by an inversion operation. There is therefore only a single $^{31}$P NMR peak. Furthermore, the phosphorus atoms are located on three-fold rotation axes. This ensures that the chemical shift anisotropy (GSA) tensor is uniaxial. The $^{31}$P NMR spectra of this compound are therefore very easy to simulate, with very few unknown parameters. In addition, the methyl proton nuclei in TMPS are relatively easy to decouple and their rapid rotational motion provides a convenient mechanism for $^{31}$P spin-lattice relaxation. A disadvantage of TMPS is that the $^{31}$P NMR spectra are quite insensitive to the spinning angle in the immediate vicinity of the magic angle. Nevertheless, the sensitivity was found to be sufficient for an initial demonstration.

All the results discussed below concern $^{1}$H-decoupled $^{31}$P NMR of TMPS obtained in a field of 9.4 T at a magic-angle-spinning frequency of 8.000 kHz.

The $^{31}$P centrebands were taken at three different spinning angles, and the spinning angles were adjusted by changing the stator orientation using the standard mechanical drive, attached to an external knob in the base of the probe. The corresponding voltages on the Hall device were measured. The Hall voltages were stable within around ±5 microvolts. The observed Hall voltage was plotted against the spinning angle offset, as determined by $^{31}$P NMR of TMPS.

When the sample temperature was changed from 5° C. to 20° C., keeping all other settings constant, the Hall voltage changed by around 20 microV. This voltage change reflects a genuine temperature-induced change in the spinning angle, presumably due to differential thermal expansion in the stator mount. Effects of this kind would be very hard to detect on an unknown sample without an NMR-independent monitoring device. We have performed several more experiments in which the sample temperature and/or spinning frequency were changed.

The results indicated that the angle offset may be determined from the Hall voltage $V_{Hall}$ with a confidence limit of around 0.01°. This confidence limit was determined by the relative insensitivity of the TMPS spectra to the spinning angle, and by the technical specifications of the current source and the voltage measurement device.

The preferred embodiments of the present invention therefore provide a Hall effect angle detector that may be very useful for a wide range of NMR experiments, allowing real-time monitoring and adjustment of the spinning angle without recourse to an independent NMR experiment. At present the inventors estimate the accuracy of the device to be around ±0.01°. The inventors expect that many solid-state NMR spectroscopists would value the presence of a spinning-angle readout that can detect small mechanical or thermal disturbances of the rotor system before an NMR experiment is run.

One of the strengths of this method of the preferred embodiments of the present invention is that the Hall sensor detects the orientation of the stator or sample holder with respect to the magnetic field, not with respect to some external, mechanical, axis system. As a result, the method does not require perfect and reproducible mounting of the probe body inside the magnet, and thermal expansion or contraction of the large probe components will not disturb it. Higher angle resolution on the order of 1 millidegree is achievable but would require stringent precautions with the mechanical alignment and mounting of the Hall device, the provision of a current source with high stability and reproducibility, and the use of a high-resolution and highly stable voltmeter. Improved shielding and stability will also be required for leads connecting the Hall device to the voltmeter. Fixing a temperature sensor to the Hall sensor would allow correction for the temperature-dependence of the device parameters. This may be necessary for high-resolution operation over a wide temperature range.

The Hall voltage may be incorporated in a feedback circuit driving a stepper motor for the angle setting, allowing a given spinning angle to be provided on demand. Small changes in the relative orientation of the magnetic field and the stator, generated by passing currents through transverse field coils, could be controlled in a similar way.

The timescale for establishing the Hall voltage is of the order of milliseconds. It should be possible to monitor the rotor axis trajectory in real time during angle-switching NMR experiments, such as dynamic-angle-spinning (DAS). This may require a compromise in the accuracy of the angular measurement, since the time-averaging mode of the voltmeter would have to be temporarily disabled to achieve sufficient time resolution.

The invention claimed is:

1. A nuclear magnetic resonance (NMR) spectrometer comprising
a magnetic field generator for generating a magnetic field of a predetermined orientation,
a rotatable mechanism, having a rotational axis, which comprises a stator supporting a rotor, the rotor being adapted to hold a sample to be tested by the spectrometer by being rotated within the magnetic field, and
a device for determining an angle between the stator and the magnetic field, the stator being provided at a location that, in use, is within a region of the magnetic field having the predetermined orientation generated by the generator, the device comprising a Hall Effect sensor which is mounted with respect to the stator, the Hall Effect sensor being mounted at a known fixed angle with respect to the rotational axis of the rotatable mechanism, wherein the plane of the Hall Effect sensor is oriented so as to be at an angle of no more than 5° with respect to the region of the magnetic field that passes, in use, through the Hall Effect sensor, and the device further comprises a voltage measuring apparatus connected to the Hall Effect sensor for measuring the Hall voltage of the Hall Effect sensor and an angle calculating device, for calculating an angle of the stator with respect to the magnetic field, based on a measured value of the Hall voltage, and the spectrometer further comprising a system for adjusting the angle of the stator and the magnetic field in response to an output of the Hall Effect sensor.

2. A nuclear magnetic resonance (NMR) spectrometer according to claim 1 wherein the Hall Effect sensor has a plane that is oriented so as to be substantially parallel to a region of the magnetic field that passes, in use, through the Hall Effect sensor.

3. A nuclear magnetic resonance (NMR) spectrometer according to claim 1 wherein the magnetic field generator is adapted to generate a magnetic field of at least 94 kiloGauss.

4. A nuclear magnetic resonance (NMR) spectrometer according to claim 1 wherein the angle calculating device calculates an angular deviation, relative to an angle of 54.74 degrees, of the rotational axis with respect to the magnetic field.

5. A nuclear magnetic resonance (NMR) spectrometer according to claim 1 wherein the Hall effect sensor is arranged to determine an angle between a plane in which the Hall effect sensor lies and the direction of the magnetic field with an accuracy of ±0.1°.

6. A nuclear magnetic resonance (NMR) spectrometer according to claim 5 wherein the Hall effect sensor is arranged to determine an angle between a plane in which the Hall effect sensor lies and the direction of the magnetic field with an accuracy of ±0.01°.

7. A nuclear magnetic resonance (NMR) spectrometer according to claim 6 wherein the Hall effect sensor is arranged to determine an angle between a plane in which the Hall effect sensor lies and the direction of the magnetic field with an accuracy of ±0.002°.

8. A nuclear magnetic resonance (NMR) spectrometer according to claim 1 wherein the Hall effect sensor is arranged to determine the angle between the direction of the magnetic field and the rotational axis of the rotor within the stator with an accuracy of ±0.1°.

9. A nuclear magnetic resonance (NMR) spectrometer according to claim 8 wherein the Hall effect sensor is arranged to determine the angle between the direction of the magnetic field and the rotational axis of the rotor within the stator with an accuracy of ±0.01°.

10. A nuclear magnetic resonance (NMR) spectrometer according to claim 1 wherein the Hall Effect sensor is mounted in a bracket that is mounted on a common support for the bracket and the stator, whereby the bracket fixes the orientation of the Hall Effect sensor relative to the stator.

11. A method of determining an angle between a stator of a nuclear magnetic resonance (NMR) spectrometer and a magnetic field, the method comprising:
(a) providing a nuclear magnetic resonance (NMR) spectrometer comprising a magnetic field generator for generating a magnetic field of a predetermined orientation and a rotatable mechanism, having a rotational axis, which comprises a stator supporting a rotor, the rotor being adapted to hold a sample to be tested by the apparatus by being rotated within the magnetic field;
(b) measuring a Hall voltage of a Hall Effect sensor mounted with respect to the stator that is disposed within the magnetic field of a predetermined orientation, the Hall Effect sensor being mounted at a known fixed angle with respect to the rotational axis of the rotatable mechanism wherein the plane of the Hall Effect sensor is oriented so as to be at an angle of no more than 5° with respect to the region of the magnetic field that passes through the Hall Effect sensor;
(c) determining an angle between the stator and the magnetic field based on a measured value of the Hall voltage; and
(d) adjusting the angle between the stator and the magnetic field in response to an output of the Hall Effect sensor, wherein the determined angle is employed to provide a feedback adjustment to set the angle to a desired value.

12. A method according to claim 11 wherein the Hall Effect sensor has a plane that is oriented so as to be substantially parallel to a region of the magnetic field that passes through the Hall Effect sensor.

13. A method according to claim 11 wherein the magnetic field has a magnetic field strength of at least 94 kiloGauss.

14. A method according to claim 11 further comprising calculating an angular deviation, relative to an angle of 54.74 degrees, of the rotational axis with respect to the magnetic field.

15. A method according to claim 11 wherein the Hall effect sensor is arranged to determine an angle between a plane in which the Hall effect sensor lies and the direction of the magnetic field with an accuracy of ±0.1°.

16. A method according to claim 15 wherein the Hall effect sensor is arranged to determine an angle between a plane in which the Hall effect sensor lies and the direction of the magnetic field with an accuracy of ±0.01°.

17. A method according to claim 16 wherein the Hall effect sensor is arranged to determine an angle between a plane in which the Hall effect sensor lies and the direction of the magnetic field with an accuracy of ±0.002°.

18. A method according to claim 11 wherein the Hall effect sensor is arranged to determine the angle between the direction of the magnetic field and the rotational axis of the rotor within the stator with an accuracy of ±0.5°.

19. A method according to claim 18 wherein the Hall effect sensor is arranged to determine the angle between the direction of the magnetic field and the rotational axis of the rotor within the stator with an accuracy of ±0.1°.

20. A method according to claim 19 wherein the Hall effect sensor is arranged to determine the angle between the direction of the magnetic field and the rotational axis of the rotor within the stator with an accuracy of ±0.01°.

* * * * *